(12) United States Patent
Yoshida et al.

(10) Patent No.: US 8,897,328 B2
(45) Date of Patent: Nov. 25, 2014

(54) SEMICONDUCTOR LASER APPARATUS AND METHOD FOR MANUFACTURING SAME

(71) Applicant: Panasonic Corporation, Osaka (JP)

(72) Inventors: Takayuki Yoshida, Shiga (JP); Naoto Ueda, Hyogo (JP); Kouji Oomori, Shiga (JP); Takuma Motofuji, Osaka (JP); Teruaki Kasai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/242,014

(22) Filed: Apr. 1, 2014

(65) Prior Publication Data

US 2014/0211819 A1 Jul. 31, 2014

Related U.S. Application Data

(63) Continuation of application No. PCT/JP2013/001348, filed on Mar. 5, 2013.

(30) Foreign Application Priority Data

Apr. 5, 2012 (JP) ................................ 2012-086119

(51) Int. Cl.
*H01S 3/04* (2006.01)
*H01S 5/024* (2006.01)
*H01S 5/022* (2006.01)
*H01S 5/028* (2006.01)

(52) U.S. Cl.
CPC ......... *H01S 5/02461* (2013.01); *H01S 5/02272* (2013.01); *H01S 5/02268* (2013.01); *H01S 5/02469* (2013.01); *H01S 5/02492* (2013.01); *H01S 5/028* (2013.01)
USPC .......................................................... 372/36

(58) Field of Classification Search
CPC .. H01S 5/02461; H01S 5/02272; H01L 21/00
USPC ........................... 372/38.02; 257/712; 438/22
See application file for complete search history.

(56) References Cited

U.S. PATENT DOCUMENTS 6,700,911 B2    3/2004  Kohashi et al.
6,972,205 B2 *  12/2005 Kohashi et al. ................. 438/22

(Continued)

FOREIGN PATENT DOCUMENTS

| JP | 01-281786 A | 11/1989 |
| JP | 05-243690 A | 9/1993 |
| JP | 06-350202 A | 12/1994 |
| JP | 08-330672 A | 12/1996 |
| JP | 11-220204 A | 8/1999 |

(Continued)

*Primary Examiner* — Colleen A Matthews
*Assistant Examiner* — Tuan Nguyen
(74) *Attorney, Agent, or Firm* — Panasonic Patent Center (57) ABSTRACT

The semiconductor laser device of the present invention has a conductive first heatsink member, a conductive first adhesive, and a semiconductor laser element. The first adhesive is disposed on the first heatsink member, and the semiconductor laser element is disposed on the first adhesive. The first adhesive reaches an upper part of the side surface of the first heatsink member under the laser emission surface for laser emission of the semiconductor laser element. The structure further improves heat dissipation of the semiconductor laser element; at the same time, it is effective in obtaining laser light from the semiconductor laser element.

20 Claims, 7 Drawing Sheets

(56) References Cited

U.S. PATENT DOCUMENTS

| | | | |
|---|---|---|---|
| 7,680,171 | B2 | 3/2010 | Yamamoto et al. |
| 7,768,120 | B2 * | 8/2010 | Takashima .................... 257/706 |
| 2001/0002916 | A1 | 6/2001 | Kohashi et al. |
| 2004/0053430 | A1 | 3/2004 | Kohashi et al. |
| 2008/0157347 | A1 | 7/2008 | Takashima |
| 2008/0192787 | A1 | 8/2008 | Yamamoto et al. |

FOREIGN PATENT DOCUMENTS

| | | |
|---|---|---|
| JP | 2001-223425 A | 8/2001 |
| JP | 2003-324228 A | 11/2003 |
| JP | 2008-166579 A | 7/2008 |
| JP | 2008-244440 A | 10/2008 |
| JP | 2008-311491 A | 12/2008 |
| JP | 2010-040933 A | 2/2010 |
| JP | 2013-004571 A | 1/2013 |

* cited by examiner

SEMICONDUCTOR LASER APPARATUS AND METHOD FOR MANUFACTURING SAME

BACKGROUND

1. Technical Field

The present invention relates to a high-power semiconductor laser device as a light source for welding, joining, and cutting in the industrial field. It also relates to a method for manufacturing the same.

2. Background Art

In recent years, a significant progress has been made in increasing output performance of semiconductor laser devices. Manufacturers in the industrial field have big expectations for semiconductor laser devices as the light source used for various processes, for example, welding, joining, and cutting.

Having a compact structure, a semiconductor laser device efficiently produces a lot of elements at the same time by a semiconductor wafer. With the advantages above, the semiconductor laser device is suitable for a small light source for tens-of-watts of output. For such a light source for high-power laser with tens-of-watts of output, an arrayed semiconductor laser device or a combined structure of a plurality of stand-alone semiconductor laser devices are employed. An arrayed semiconductor laser device has a plurality of adjacent active regions in a single chip. On the edge of a chip, the device has a plurality of adjacent emitting points, i.e., emitters. A stand-alone semiconductor laser device has a single emitter.

The laser light fed from a semiconductor laser device can be concentrated into several micron scale. With the high capability of light-gathering, a semiconductor laser device focuses light energy on an extremely small area, providing an optimal pinpoint process.

The semiconductor laser devices above work with a light output ranging from approximately ten watts to tens of watts. Compared to laser devices with hundreds of milliwatts scale of output used for optical disks, the aforementioned semiconductor laser devices have extremely large actuating current and a large amount of heat generation in the active regions. Therefore, to obtain high reliability of the devices, i.e., to maintain high output and long-life operation, what important is quick heat dissipation from the active, regions to the outside so as to suppress the temperature rise in the active regions.

To address the problems above, semiconductor laser devices capable of enhancing heat dissipation of a chip have been suggested (see Japanese Unexamined Patent Application Publication No. H01-281786, No. 2008-311491, No. 2010-40933, for example). A conventional semiconductor laser device shown in patent literature 3 will be described with reference to FIG. 15.

Figure 15:
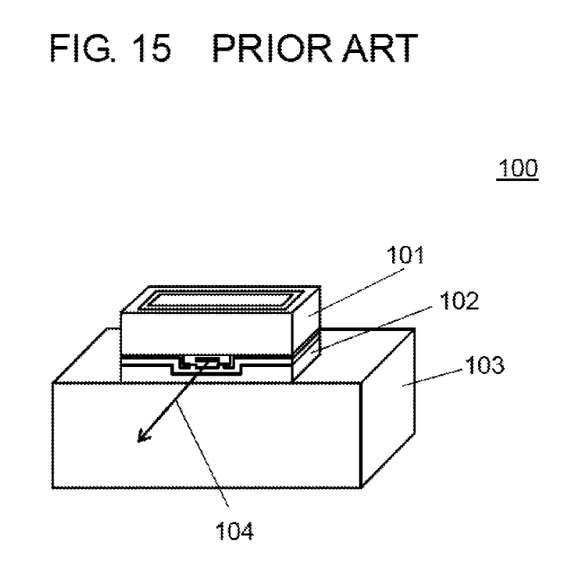
FIG. 15 is a perspective vies of a conventional semiconductor laser device.

FIG. 15 is a perspective view of conventional semiconductor laser device 100. According to conventional semiconductor laser device 100, as shown in FIG. 15, semiconductor laser element 101 is mounted on heatsink 103 via solder layer 102. Conventional semiconductor laser device 100 emits laser light 104 from the laser emission surface (i.e., from the front surface seen in FIG. 15) of semiconductor laser element 101. In conventional semiconductor laser device 100, semiconductor laser element 101 is connected to heatsink 103 with solder layer 102 so that the laser emission surface of element 101 is level with the side surface of heatsink 103.

The structure above protects laser light 104 from being blocked by heatsink 103; at the same time, heatsink 103 sufficiently dissipates heat of semiconductor laser element 101.

SUMMARY

However, the conventional semiconductor laser device has a problem. In connecting semiconductor laser element 101 to heatsink 103 via solder layer 102, the solder layer 102 can stick out from the laser emission surface of semiconductor laser element 101 in the output direction of laser light 104. If such a projection of solder layer 102 blocks the path of laser light 104, an intended output of laser light 104 cannot be obtained.

However, to prevent the stick-out of solder layer 102, if the edge of solder layer 102 is set back from the laser emission surface of semiconductor laser element 101, heatsink 103 cannot sufficiently dissipate heat of extremely heated laser emission surface.

Besides, the laser emission surface of semiconductor laser element 101 is subject to breakage by catastrophic optical damage (COD). COD is a self-destructive phenomenon that the laser light of semiconductor laser element 101 destroys the laser emission surface thereof. Particularly, laser light density in the laser emission surface has a sudden increase by return light from an optical member (not shown) disposed opposite to the laser emission surface of semiconductor laser element 101, which is called filamentation effect. If it occurs in the laser emission surface from which heat has not been sufficiently dissipated, damage to semiconductor laser element 101 often results from the insufficient heat dissipation.

To address the problem above, the present invention provides a high-power semiconductor laser device capable of offering stable, uniform characteristics, and high reliability. It also provides the method for manufacturing the laser device.

The semiconductor laser device of the present invention has a conductive first heatsink member, a conductive first adhesive, and a semiconductor laser element. The first adhesive is disposed on the first heatsink member, and over which, the semiconductor laser element is disposed. The first adhesive is disposed on the first heatsink member so as to reach an upper part on the side surface of the first heatsink member under the end section of the emitter for emitting laser light of the semiconductor laser element.

The method for manufacturing a semiconductor laser device has a step of mounting a semiconductor laser element on a conductive first heatsink member via a conductive first adhesive. The first adhesive is disposed on the first heatsink member so as to reach an upper part on the side surface of the first heatsink member under the end section of the emitter for emitting laser light of the semiconductor laser element.

The structure above further improves heat dissipation of the semiconductor laser element; at the same time, it is effective in obtaining laser light from the semiconductor laser element.

The present invention provides a high-power semiconductor laser device and the manufacturing method capable of offering stable, uniform characteristics and high reliability.

DETAILED DESCRIPTION OF THE PREFERRED EMBODIMENTS

Hereinafter, exemplary embodiments of the present, invention will be described with reference to accompanying drawings. In the drawings, like components have the same reference marks and the descriptions thereof may be omitted. Throughout the drawings, each component is schematically shown for the sake of easy understanding.

First Exemplary Embodiment

Figure 1:
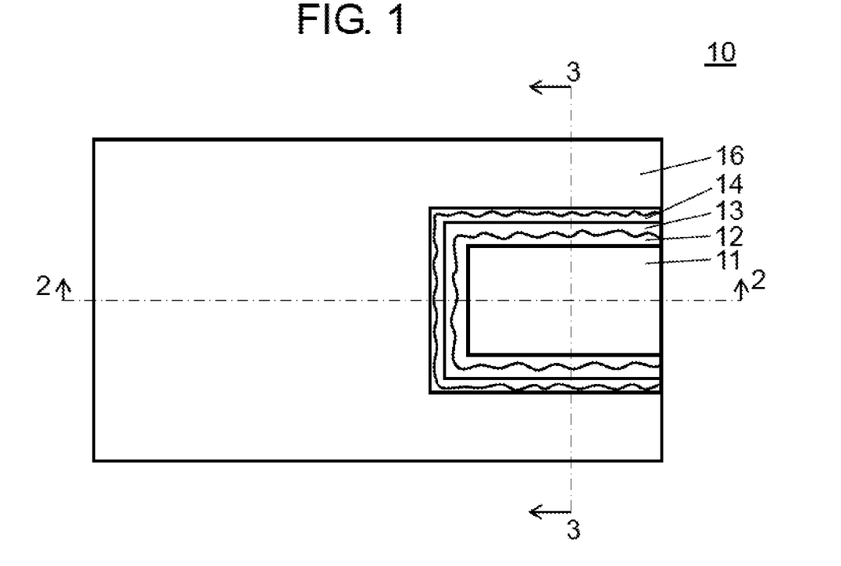
FIG. 1 is a plan view of a semiconductor laser device in accordance with a first exemplary embodiment.
Figure 2:
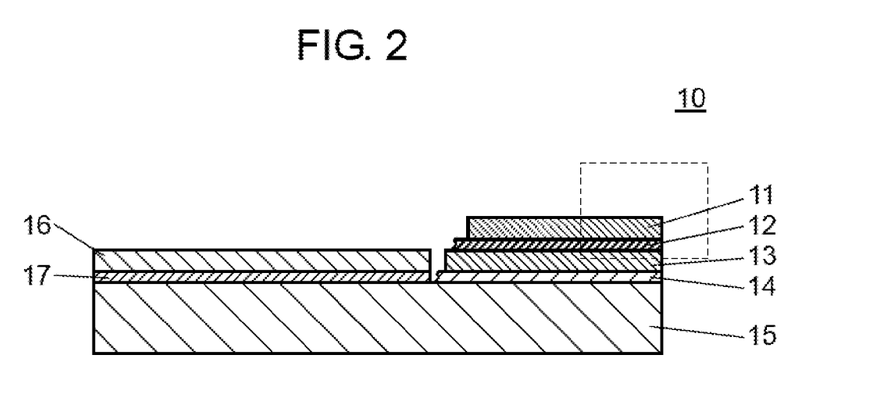
FIG. 2 is a cross-sectional view, taken along the line 2-2 of FIG. 1, of the semiconductor laser device in accordance with the first exemplary embodiment.
Figure 3:
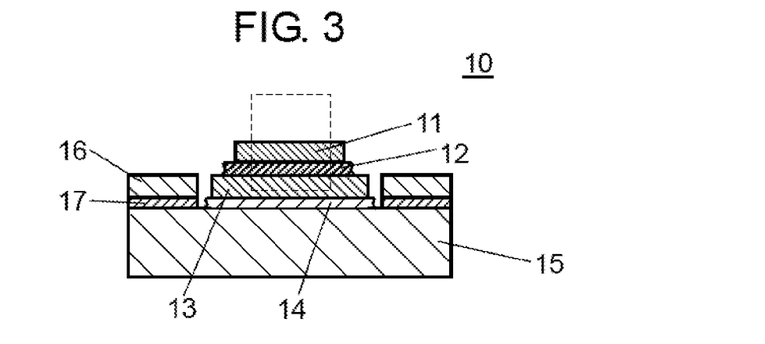
FIG. 3 is a cross-sectional view, taken along the line 3-3 of FIG. 1, of the semiconductor laser device in accordance with the first exemplary embodiment.
Figure 4:
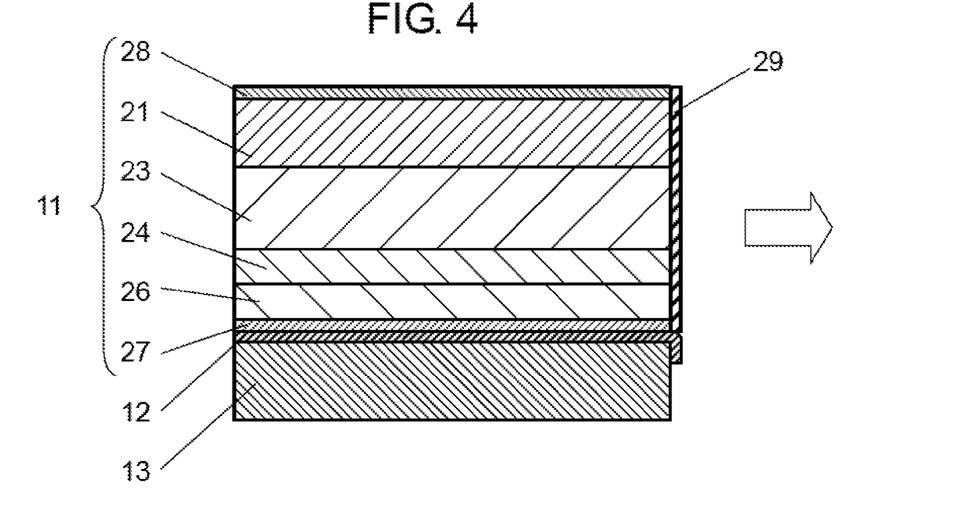
FIG. 4 is a cross-sectional view, enlarged the part indicated by dotted lines in FIG. 2, of the semiconductor laser device in accordance with the first exemplary embodiment.
Figure 5:
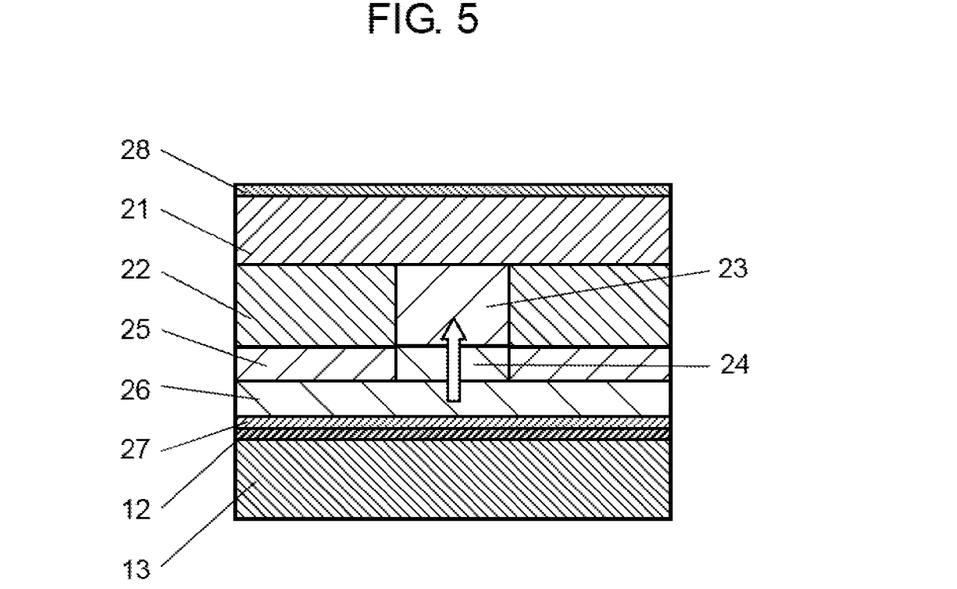
FIG. 5 is a cross-sectional view, enlarged the part indicated by dotted lines in FIG. 3, of the semiconductor laser device in accordance with the first exemplary embodiment.

FIG. 1 is a plan view of semiconductor laser device 10 in accordance with the first exemplary embodiment. FIG. 2 is a cross-sectional view, taken along the line 2-2 of FIG. 1, of semiconductor laser device 10 in accordance with the exemplary embodiment. FIG. 3 is a cross-sectional view, taken along the line 3-3 of FIG. 1, of semiconductor laser device 10 in accordance with the exemplary embodiment. FIG. 4 is a cross-sectional view, enlarged the part indicated by dotted lines in FIG. 2, of semiconductor laser device 10 in accordance with the exemplary embodiment. FIG. 5 is a cross-sectional view; enlarged the part indicated by dotted lines in FIG. 3, of semiconductor laser device 10 in accordance with the exemplary embodiment.

Semiconductor laser device 10 of the present invention, as shown in FIG. 1 through FIG. 3, has semiconductor laser element 11, solder layer 12 as a conductive first adhesive, and sub-mount 13 as a conductive first heatsink member. Semiconductor laser device 10 of the present invention further contains solder layer 14 as a conductive second adhesive, heatsink 15 as a conductive second heatsink member, conductive bonding plate 16, and insulating adhesive tape 17. Semiconductor laser element 11 has the laser emission surface (shown on the right side in FIG. 1 and FIG. 2), and laser light is emitted from the laser emission surface toward the right direction (seen in the drawings).

Solder layer 12 is gold-tin (AuSn)-based solder with a thickness of 2-5 μm. Semiconductor laser element 11 is bonded to sub-mount 13 with solder layer 12. Solder layer 12 is formed on sub-mount 13 by evaporation or plating, and after that, semiconductor laser element 11 is bonded to solder layer 12 formed on sub-mount 13.

Solder layer 12 should be formed so as to contact with the entire bottom surface of semiconductor laser element 11. As shown in FIG. 1 through FIG. 3, solder layer 12 should preferably be stuck out from the side surfaces—except for the laser emission surface—of semiconductor laser element 11. This allows solder layer 12 to thoroughly cover the bottom surface of semiconductor laser element 11. Solder layer 12 may be formed on the entire upper surface of sub-mount 13.

Sub-mount 13, which is mainly made of copper-tungsten (CuW), has a thickness of approximately 300 μm. Aluminum nitride (AlN) may be employed for the material of sub-mount 13.

Solder layer 14 is tin-silver (SnAg)-based solder with a thickness of approximately 20 μm. Sub-mount 13 is bonded to heatsink 15 with solder layer 14. Solder layer 14 of foil is formed on heatsink 15, and after that sub-mount 13 is bonded to solder layer 14 formed on heatsink 15. Sub-mount 13 is mounted on heatsink 15 via solder layer 14, with the surface irregularities of heatsink 15 eased by the thickness of solder layer 14. The structure above enhances heat dissipation from sub-mount 13 to heatsink 15.

According to the structure of the embodiment, on the laser emission side, the side surface of sub-mount 13 is nearly level with the side surface of heatsink 15. However, the side surface of sub-mount 13 may be set back from the side surface of heatsink 15 (not shown), as long as the laser light from semiconductor laser element 11 is not blocked by the positioning. Further, the side surface of sub-mount 13 may be stuck out from the side surface of heatsink 15 (not shown), as long as an intended heat dissipation to heatsink 15 is guaranteed.

Solder layer 14 is formed so as to completely cover the overlapping area of sub-mount 13 and heatsink 15. This is because that the influence on semiconductor laser element 11 by heat dissipation from semiconductor laser element 11 to sub-mount 13 is smaller than the influence on semiconductor laser element 11 by heat dissipation from sub-mount 13 to heatsink 15. Preferably, as shown in FIG. 1 through FIG. 3, solder layer 14 should stick out from the side surfaces—except for the laser emission surface—of semiconductor laser element 11. With the structure above, heat dissipation from sub-mount. 13 to heatsink 15 is achieved with reliability.

Adhesive tape 17 is made of polyimide. Bonding plate 16 is attached to heatsink 15 with adhesive tape 17. As long as having insulation property, the shape and the material of adhesive tape 17 are not limited to above. Besides, adhesive tape 17 may be not formed all over the bottom surface of bonding plate 16—at least bonding heatsink 15 with bonding plate 16.

Bonding plate 16 is made of copper. Bonding plate 16 is connected to the upper surface of semiconductor laser element 11 with a gold wire (not shown). Bonding plate 16 of U-shape, as shown in the plan view of FIG. 1, is disposed so as to surround semiconductor laser element 11. The arrangement allows the gold wire to increase in number for connecting semiconductor laser element 11 and bonding plate 16. However, bonding plate 16 is not necessarily formed into U in planer shape, and its material is not limited to copper as long as being conductive.

Bonding plate 16 and heatsink 15 are electrically separated from each other by the adhesive tape. Therefore, a first voltage can be applied to the upper surface of semiconductor laser element 11 via bonding plate 16; and at the same time, a second voltage different from the first voltage can be applied to the lower surface of semiconductor laser element 11 via heatsink 15 and sub-mount 13. The application of voltage above allows semiconductor laser element 11 to have emission of laser light.

Next, the structure of semiconductor laser element 11 is described with reference to FIG. 4 and FIG. 5. FIG. 4 is a cross-sectional view, enlarged the part indicated by dotted lines in FIG. 2, of semiconductor laser device 10 in accordance with the embodiment. FIG. 5 is a cross-sectional view, enlarged the part indicated by dotted lines in FIG. 3, of semiconductor laser device 10 in accordance with the embodiment.

Semiconductor laser element 11 of the embodiment, as shown in FIG. 4 and FIG. 5, has n-type semiconductor substrate 21, current constriction layer 22, current transmission window layer 23, laser output emitter 24, active layer 25, p-type semiconductor layer 26, p-electrode 27, n-electrode 28, and antireflection film 29. P-electrode 27 is formed on p-type semiconductor layer 26, whereas n-electrode 28 is formed on n-type semiconductor substrate 21. Antireflection film 29 is formed on the surface on the laser emission side of semiconductor laser element 11.

Antireflection film 29 is made of, for example, aluminum oxide (AlO), silicon oxide (SiO), and silicon nitride (SiN). Antireflection film 29 should preferably be formed so as not to have an intrusion under p-electrode 27 because it impairs adhesiveness of solder layer 12.

Laser light is emitted in the direction indicated by the arrow shown on the right of FIG. 4. Current flows in the direction indicated by the arrow shown in FIG. 5.

Figure 6:
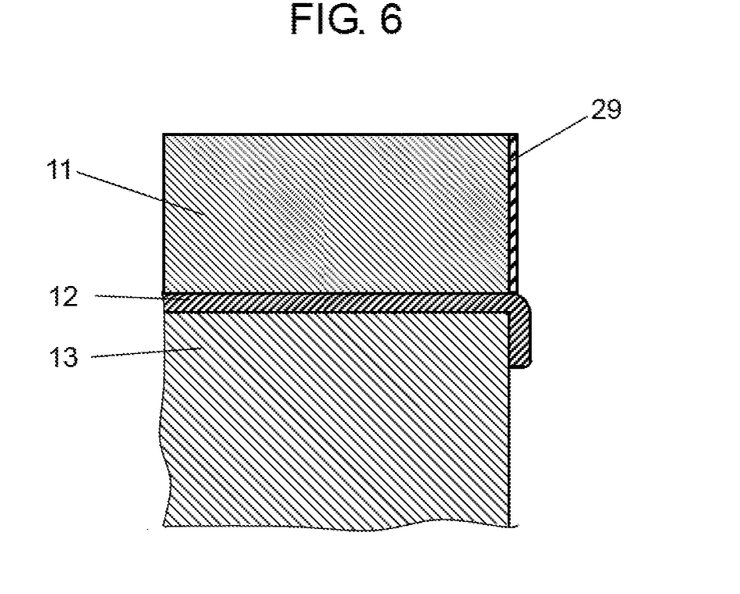
FIG. 6 is a cross-sectional view illustrating the laser emission of the semiconductor laser device in accordance with the first exemplary embodiment.

FIG. 6 is a cross-sectional view illustrating the laser emission surface of semiconductor laser device 10 in accordance with the embodiment.

As shown in FIG. 6, the laser emission surface of semiconductor laser element 11 is nearly level with the side surface of sub-mount 13. On the laser emission side, solder layer 12 in stills between semiconductor laser element 11 and sub-mount 13 and further extends to the side surface of sub-mount 13.

The laser emission surface of semiconductor laser element 11 is exposed to high temperatures during laser-light emission, by which semiconductor laser element 11 is often damaged. According to the structure of the embodiment, solder layer 12 covers the bottom surface completely and extends to the end on the laser emission side of semiconductor laser element 11. The structure offers sufficient heat dissipation. Further, as described above, solder layer 12 extends to the side surface of sub-mount 13. This increases the contact area with sub-mount 13, enhancing heat dissipation. In addition, solder layer 12 is guided to the side of sub-mount 13, so that there is no obstacle in the path of laser light emitted from semiconductor laser element 11.

Modified Example 1

Figure 7:
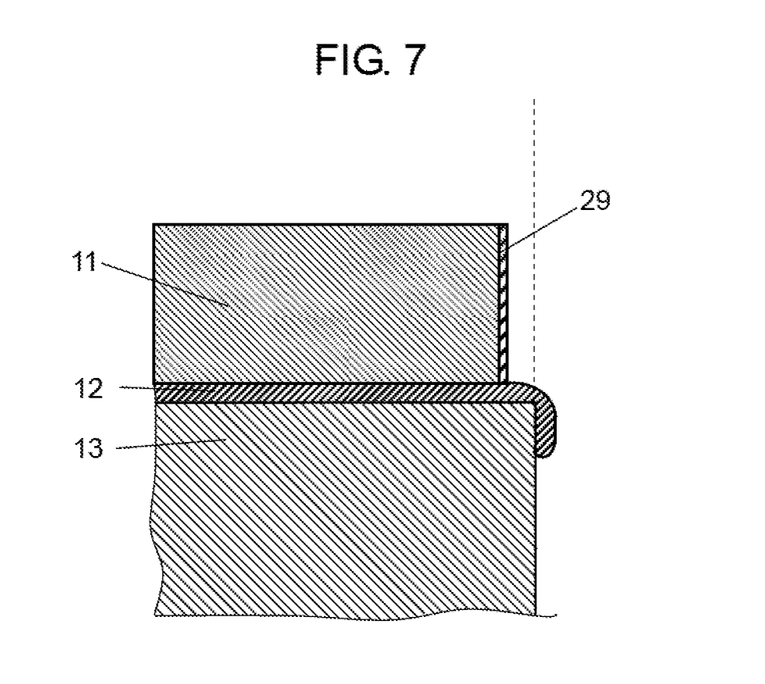
FIG. 7 is a cross-sectional view illustrating modified example 1 of the laser emission surface of the semiconductor laser device in accordance with the first exemplary embodiment.

FIG. 7 is a cross-sectional view illustrating modified example 1 of the laser emission surface of semiconductor laser device 10 in accordance with the exemplary embodiment.

As shown in FIG. 7, the laser emission surface of semiconductor laser element 11 is disposed inner than the side surface of sub-mount 13. In other words, the laser emission surface of semiconductor laser element 11 is closer to the center of sub-mount 13 than the side surface of sub-mount 13. The structure allows solder layer 12 to completely infill between semiconductor laser element 11 and sub-mount 13, enhancing heat dissipation.

In the positioning above, the distance (in a planar view) between the side surface of sub-mount 13 and the set-back laser emission surface of semiconductor laser element 11 should preferably be determined to 5 µm or less. This prevents laser light emitted from semiconductor laser element 11 from being blocked by solder layer 12.

Modified Example 2

Figure 8:
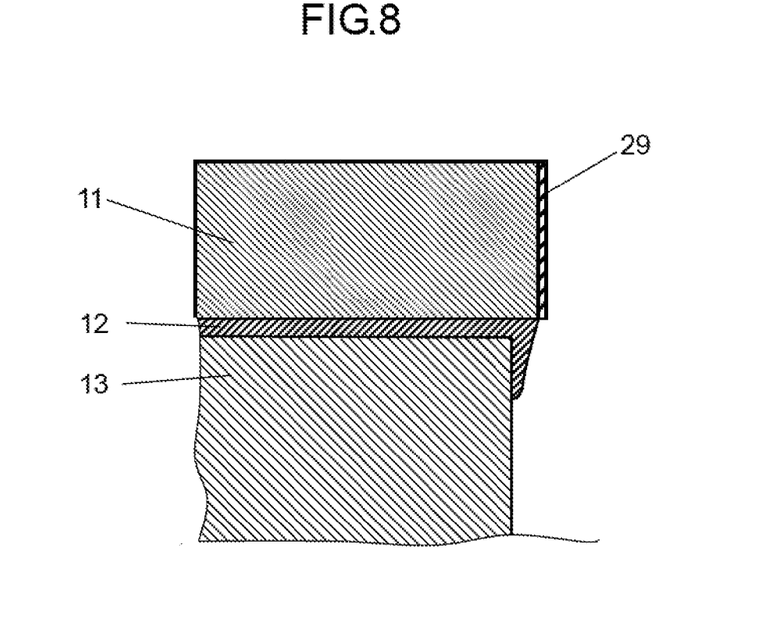
FIG. 8 is a cross-sectional view illustrating modified example 2 of the laser emission surface of the semiconductor laser device in accordance with the first exemplary embodiment.

FIG. 8 is a cross-sectional view illustrating modified example 2 of the laser emission surface of semiconductor laser device 10 in accordance with the exemplary embodiment.

As shown in FIG. 8, the laser emission surface of semiconductor laser element 11 is disposed outer than the side surface of sub-mount 13. In other words, the laser emission surface of semiconductor laser element 11 is disposed away from the center of sub-mount 13 than the side surface of sub-mount 13. The positioning guarantees laser light emitted from semiconductor laser element 11 against being blocked by solder layer 12.

In the positioning above, the distance (in a planar view) between the side surface of sub-mount 13 and the laser emission surface of semiconductor laser element 11 should preferably be determined to 10 µm or less; more preferable, 5 µm or less. With the positioning above, heat dissipation from semiconductor laser element 11 to sub-mount 13 is sufficiently obtained.

Modified Example 3

Figure 9:
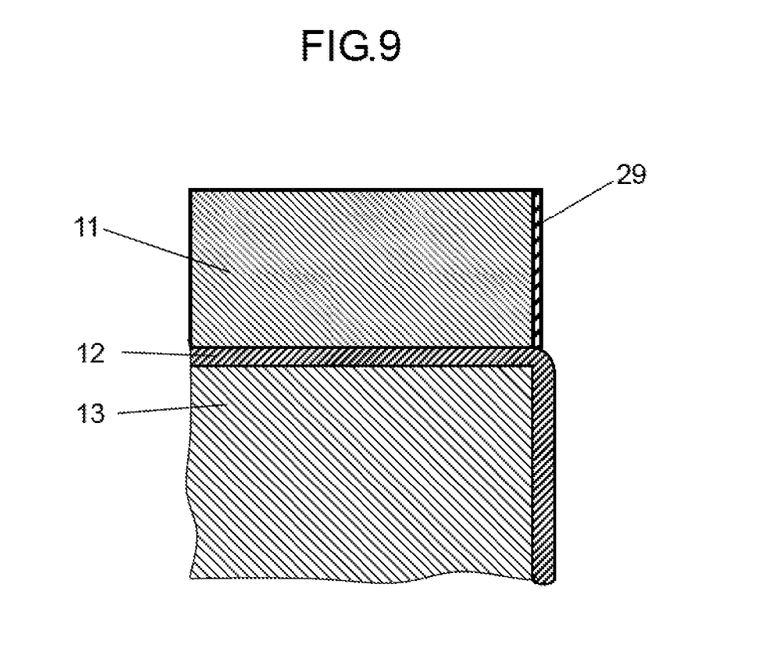
FIG. 9 is a cross-sectional view illustrating modified example 3 of the laser emission surface of the semiconductor laser device in accordance with the first exemplary embodiment.

FIG. 9 is a cross-sectional view illustrating modified example 3 of the laser emission surface of semiconductor laser device 10 in accordance with the exemplary embodiment.

As shown in FIG. 9, solder layer 12 is formed all over the side surface of sub-mount 13. The structure allows solder layer 12 to be formed so as to firmly contact with sub-mount 13 and completely infill between semiconductor laser element 11 and sub-mount 13.

Modified Example 4

Figure 10:
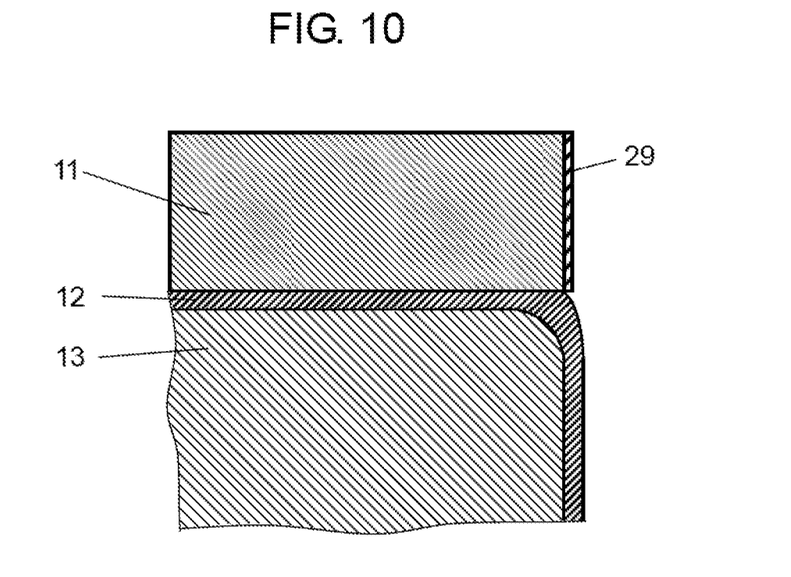
FIG. 10 is a cross-sectional view illustrating modified example 4 of the laser emission surface of the semiconductor laser device in accordance with the first exemplary embodiment.

FIG. 10 is a cross-sectional view illustrating modified example 4 of the laser emission surface of semiconductor laser device 10 in accordance with the exemplary embodiment.

As shown in FIG. 10, the upper surface of sub-mount 13 has a chamfered edge on the laser emission side of semiconductor laser element 11. The structure guarantees laser light emitted from semiconductor laser element 11 against being blocked by solder layer 12. Besides, the structure allows solder layer 12 to completely infill between sub-mount 13 and semiconductor laser element 11 on the side of the laser emission surface. This enhances heat dissipation.

In the example, the chamfered edge of sub-mount 13 has a curved cross section, but it is not limited to. The edge may be chamfered linearly.

To form solder layer 12 so as to conform to the side surface of sub-mount 13, as shown in FIG. 6 through FIG. 10, it is preferable that the side surface of sub-mount 13 should be coated with a solder-layer guide film (not shown) having high wettability (i.e., affinity) for solder layer 12. The film coating allows solder layer 12 to be guided toward sub-mount 13, which guarantees laser light emitted from semiconductor laser element 11 against being blocked by solder layer 12.

As shown in FIG. 6 through FIG. 10, antireflection film 29 is formed on the laser emission surface of semiconductor laser element 11. Preferably, antireflection film 29 should be a material with low affinity for solder layer 12. This prevents solder layer 12 from intruding into the laser emission surface of semiconductor laser element 11 and therefore guarantees laser light emitted from semiconductor laser element 11 against being blocked by solder layer 12.

In FIG. 6 through FIG. 8, solder layer 12 is extended to only the upper part of the side surface of sub-mount 13, but it is not limited to. Solder layer 12 may be formed over the whole area of the side surface of sub-mount 13. In that case, solder layer 12 formed on the upper part of the side surface of sub-mount 13 has a thickness greater than that of solder layer 12 disposed on other parts of sub-mount 13.

Further, the structures shown in FIG. 7 and FIG. 8—where the laser emission surface of semiconductor laser element 11 is shifted from the side surface of sub-mount 13 on the laser emission side—are also applicable to the structures shown in FIG. 9 and FIG. 10.

Next, the method for manufacturing the semiconductor laser device of the exemplary embodiment is described with reference to FIG. 11 through FIG. 13.

Manufacturing Method

Figure 11:
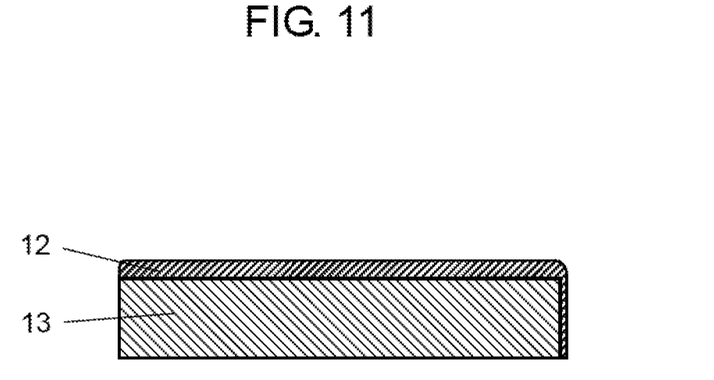
FIG. 11 is a cross-sectional view illustrating a method for manufacturing the semiconductor laser device in accordance with the first exemplary embodiment.
Figure 12:
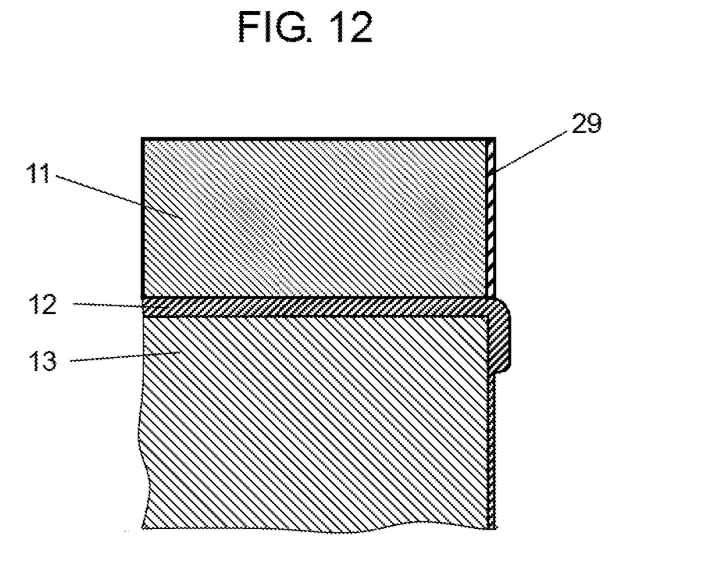
FIG. 12 is a cross-sectional view illustrating the method for manufacturing the semiconductor laser device in accordance with the first exemplary embodiment.
Figure 13:
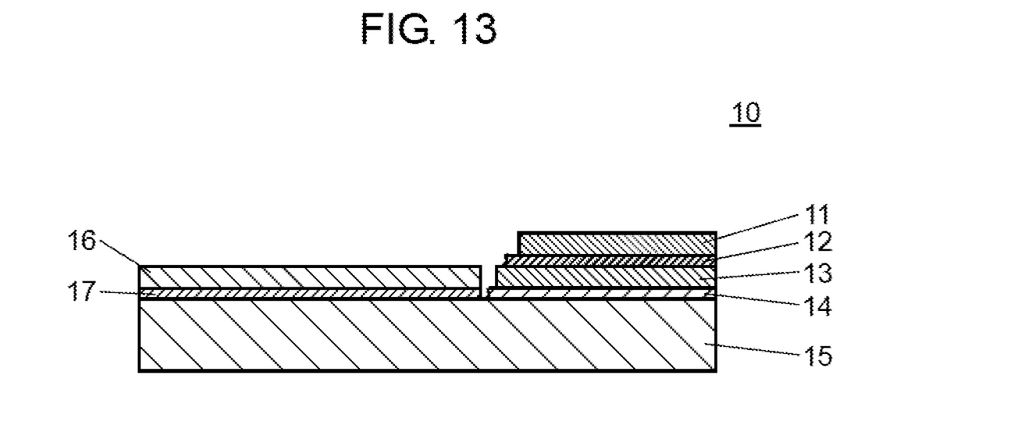
FIG. 13 is a cross-sectional view illustrating the method for manufacturing the semiconductor laser device in accordance with the first exemplary embodiment.

FIG. 11 through FIG. 13 are cross-sectional views illustrating the method for manufacturing the semiconductor laser device in accordance with the exemplary embodiment.

As shown in FIG. 11, solder layer 12 is formed on sub-mount 13. Solder layer 12 is evaporated or plated onto the upper and side surfaces of sub-mount 13. Solder layer 12 is not necessarily formed on the entire area of the side surface of sub-mount 13; it is formed at least on the upper part of the side surface. Solder layer 12 formed on the upper surface of sub-mount 13 has a thickness of approximately 2 μm. On the side surface of sub-mount 13, solder layer 12 has a thickness smaller than that on the upper surface. Solder layer 12 is formed with an amount enough for infilling completely between sub-mount 13 and semiconductor laser element 11 to be mounted thereon.

Next, as shown in FIG. 12, semiconductor laser element 11 is mounted on sub-mount 13 so that the laser emission surface of semiconductor laser element 11 is nearly level with the side surface of sub-mount 13. At that time, on the laser emission side of semiconductor laser element 11, solder layer 12 is guided by the solder layer disposed at least on the upper part of the side surface of sub-mount 13 and reaches the side surface of sub-mount 13. On the side surfaces, except for the laser emission side, solder layer 12 sticks out of semiconductor laser element 11.

The structure above enhances heat dissipation from semiconductor laser element 11 to sub-mount 13, and at the same time, it prevents laser light emitted from semiconductor laser element 11 from being blocked by solder layer 12.

Semiconductor laser element 11 may be mounted on sub-mount 13 so as to have a positional relation shown in FIG. 7 and FIG. 8. In that case, too, the structure offers the effects the same as those obtained by the structures shown in FIG. 7 and FIG. 8.

Besides, in the step of forming solder layer 12 on sub-mount 13, solder layer 12 may be formed all over the area of the side surface of sub-mount 13, as shown in FIG. 9. In that case, the structure offers the effect the same as that obtained by the structure shown in FIG. 9.

Further, the upper surface of sub-mount 13 may have an angled edge, as shown in FIG. 10, on the laser emission side of semiconductor laser element 11. In that case, the structure offers the effect the same as that obtained by the structure shown in FIG. 10.

Next, as shown in FIG. 13, sub-mount 13 is mounted on heatsink 15 via solder layer 14. After that, bonding plate 16 is bonded to heatsink 15 with adhesive tape 17. Through the steps above, the semiconductor laser device shown in FIG. 1 through FIG. 3 is completed.

Second Exemplary Embodiment

Figure 14:
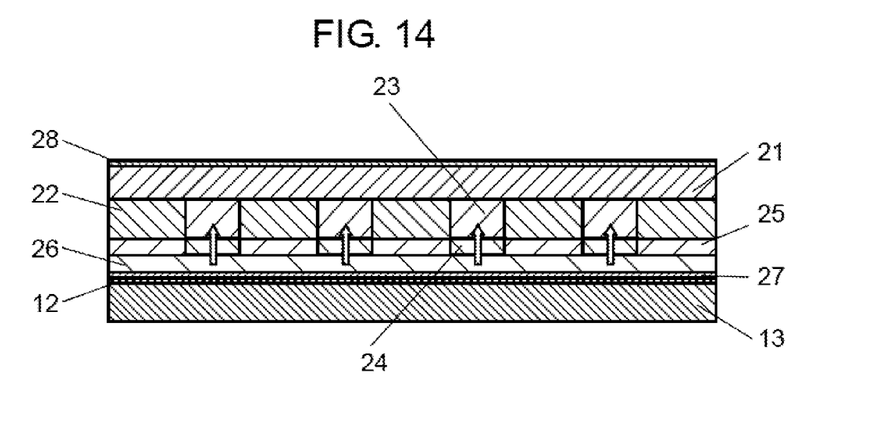
FIG. 14 is a cross-sectional view of a semiconductor laser device in accordance with a second exemplary embodiment.

FIG. 14 is a cross-sectional view of a semiconductor laser element of a semiconductor laser device in accordance with the second exemplary embodiment. For the common points to the structure of the first exemplary embodiment, the descriptions thereof will be omitted.

The semiconductor laser element of the exemplary embodiment, as shown in FIG. 14, has four current transmission window layers 23 and four laser output emitters 24. That is, the semiconductor laser element of the embodiment emits four laser beams.

The structure above allows a single semiconductor laser device to offer a plurality of laser beams, contributing to downsizing and cost reduction. Besides, compared to a system in which a plurality of laser beams is obtained by a plurality of semiconductor laser devices, the structure of the embodiment significantly reduces the manufacturing steps.

The present invention provides a high-power semiconductor laser device capable of offering stable, uniform characteristics, and high reliability, and also provides the method for manufacturing the semiconductor laser device. The semiconductor laser device is useful not only as a light source for devices for welding, joining, and cutting in the industrial field, but also as a semiconductor-laser light source for communications and commercial use.

What is claimed is:

1. A semiconductor laser device comprising:
   a conductive first heatsink member;
   a conductive first adhesive disposed on the conductive first heatsink member;
   a semiconductor laser element disposed on the conductive first adhesive;
   an antireflection film formed on a laser emission surface of the semiconductor laser element;
   a conductive second heatsink member;
   a conductive second adhesive disposed on a first portion of the conductive second heatsink member, the conductive first heatsink member being disposed on the conductive second adhesive;
   an insulating adhesive tape disposed on a second portion of the conductive second heatsink member; and
   a conductive bonding plate disposed on the insulating adhesive tape,
   wherein, the conductive first adhesive reaches a side surface of the conductive first heatsink member on a laser emission side under the laser emission surface of the semiconductor laser element;

an affinity of the antireflection film for the conductive first adhesive is lower than an affinity of the conductive first heatsink member for the conductive first adhesive, the conductive first adhesive formed on an upper part of the side surface of the conductive first heatsink member on the laser emission side has a thickness greater than a thickness of the conductive first adhesive disposed on other parts other than the upper part of the side surface of the conductive first heatsink member on the laser emission side, and the conductive bonding plate is formed into a U-shape in a planar view so as to surround the semiconductor laser element.

2. The semiconductor laser device according to claim 1, wherein the laser emission surface of the semiconductor laser element is level with the side surface of the conductive first heatsink member on the laser emission side.

3. The semiconductor laser device according to claim 1, wherein the laser emission surface of the semiconductor laser element is closer to a center of the conductive first heatsink member than the side surface of the conductive first heatsink member on the laser emission side.

4. The semiconductor laser device according to claim 3, wherein a distance in a planar view between the laser emission surface of the semiconductor laser element and the side surface of the conductive first heatsink member on the laser emission side is determined to 5 µm or less.

5. The semiconductor laser device according to claim 1, wherein the laser emission surface of the semiconductor laser element is disposed away from a center of the conductive first heatsink member than the side surface of the conductive first heatsink member on the laser emission side.

6. The semiconductor laser device according to claim 5, wherein a distance in a planar view between the laser emission surface of the semiconductor laser element and the side surface of the conductive first heatsink member on the laser emission side is determined to 5 µm or less.

7. The semiconductor laser device according to claim 1, wherein the conductive first adhesive is formed all over the side surface of the conductive first heatsink member on the laser emission side.

8. The semiconductor laser device according to claim 1, wherein the conductive first adhesive is gold-tin (AuSn)-based solder.

9. The semiconductor laser device according to claim 1, wherein the conductive first heatsink member is mainly made of copper-tungsten (CuW).

10. The semiconductor laser device according to claim 1, wherein the conductive second adhesive is tin-silver (SnAg)-based solder.

11. The semiconductor laser device according to claim 1, wherein the insulating adhesive tape is made of polymide.

12. The semiconductor laser device according to claim 1, wherein the conductive bonding plate is made of copper.

13. The semiconductor laser device according to claim 1, further comprising a gold wire connecting the conductive bonding plate to an upper surface of the semiconductor laser element.

14. The semiconductor laser device according to claim 1, wherein the antireflection film is made of aluminum oxide (AlO).

15. The semiconductor laser device according to claim 1, wherein the antireflection film is made of silicon oxide (SiO).

16. The semiconductor laser device according to claim 1, wherein the antireflection film is made of silicon nitride (SiN).

17. A method for manufacturing a semiconductor laser device comprising:

forming an antireflection film on a laser emission surface of a semiconductor laser element;

mounting a semiconductor laser element on a conductive first heatsink member via a conductive first adhesive;

mounting the conducting first heatsink member on a first portion of a conductive second heat sink member via a conductive second adhesive; and mounting a conductive bonding plate on a second portion of the conductive second heatsink member via an insulating adhesive tape, wherein, the conductive first adhesive reaches an upper part of a side surface of the conductive first heatsink member on a laser emission side under the laser emission surface of the semiconductor laser element, an affinity of the antireflection film for the conductive first adhesive is lower than an affinity of the conductive first heatsink member for the first adhesive, the conductive first adhesive formed on an upper part of the side surface of the conductive first heatsink member on the laser emission side has a thickness greater than a thickness of the conductive first adhesive disposed on other parts other than the upper part of the side surface of the conductive first heatsink member on the laser emission side, and the conductive bonding plate is formed into a U-shape in a planar view so as to surround the semiconductor laser element.

18. The method for manufacturing the semiconductor laser device according to claim 17 further comprising:

forming the conductive first adhesive on an upper surface of the conductive first heatsink member and on the side surface of the conductive first heatsink member on a laser emission side, wherein, the forming step is performed before the step of mounting the semiconductor laser element.

19. The method for manufacturing the semiconductor laser device according to claim 18, wherein, in the forming step of the conductive first adhesive, the conductive first adhesive is formed by evaporation or plating.

20. The method for manufacturing the semiconductor laser device according to claim 18, wherein, in the mounting step of the semiconductor laser element, the conductive first adhesive formed on an upper part of the side surface of the conductive first heatsink member on the laser emission side has a thickness greater than a thickness of the conductive first adhesive disposed on other parts other than the upper part of the side surface of the conductive first heatsink member on the laser emission side.

* * * * *